United States Patent
Wei et al.

(10) Patent No.: US 9,801,288 B2
(45) Date of Patent: Oct. 24, 2017

(54) MULTILAYER CIRCUIT BOARD AND METHOD FOR MANUFACTURING THE SAME

(71) Applicant: TONG HSING ELECTRONICS INDUSTRIES, LTD., Taipei (TW)

(72) Inventors: Chien-Cheng Wei, Taipei (TW); Ta-Hsiang Chiang, New Taipei (TW)

(73) Assignee: Tong Hsing Electronic Industries, Ltd., Taipei (TW)

( * ) Notice: Subject to any disclaimer, the term of this patent is extended or adjusted under 35 U.S.C. 154(b) by 206 days.

(21) Appl. No.: 14/700,229

(22) Filed: Apr. 30, 2015

(65) Prior Publication Data
US 2015/0319868 A1 Nov. 5, 2015

(30) Foreign Application Priority Data

May 1, 2014 (TW) .............................. 103115713 A

(51) Int. Cl.
*H05K 3/46* (2006.01)
*H05K 3/00* (2006.01)
(Continued)

(52) U.S. Cl.
CPC ......... *H05K 3/4661* (2013.01); *H05K 1/0298* (2013.01); *H05K 1/0306* (2013.01);
(Continued)

(58) Field of Classification Search
CPC .... H05K 1/0204; H05K 1/0207; H05K 1/111; H05K 1/181; H05K 1/0298; H05K 3/46; H05K 3/4605
See application file for complete search history.

(56) References Cited

U.S. PATENT DOCUMENTS

2013/0320547 A1* 12/2013 Zhang ................ H01L 23/5389
257/766
2014/0021851 A1* 1/2014 Heo ....................... H05B 33/02
313/113
(Continued)

FOREIGN PATENT DOCUMENTS

TW          I299244 B      7/2008

OTHER PUBLICATIONS

Ting-Hao Lin, "General printed circuit board technology," Taiwan Printed Circuit Association, Jul. 2008, p. 29, 174 & 175. (with English translation of Figure 2 and Table 5).

*Primary Examiner* — Hoa C Nguyen
*Assistant Examiner* — Amol Patel
(74) *Attorney, Agent, or Firm* — McNees Wallace & Nurick LLC

(57) ABSTRACT

A method for manufacturing a multilayer circuit board includes: forming a first patterned conductive layer on a ceramic substrate, the first patterned conductive layer having a first circuit pattern and a first submount pattern; forming a second patterned conductive layer on the first patterned conductive layer, the second patterned conductive layer having a second circuit pattern and a second submount pattern; forming an insulating layer on the ceramic substrate; and forming a third patterned conductive layer on the insulating layer. The third patterned conductive layer having a third circuit pattern and a third submount pattern. The first, second and third submount patterns are stacked one above another.

5 Claims, 9 Drawing Sheets

(51) Int. Cl.
*H05K 1/02* (2006.01)
*H05K 1/03* (2006.01)
*H05K 1/09* (2006.01)
*H05K 3/24* (2006.01)

(52) U.S. Cl.
CPC .......... H05K 1/092 (2013.01); H05K 3/0091 (2013.01); H05K 3/46 (2013.01); H05K 3/4605 (2013.01); H05K 3/244 (2013.01); H05K 2201/10106 (2013.01)

(56) References Cited

U.S. PATENT DOCUMENTS

| | | | |
|---|---|---|---|
| 2016/0105958 A1* | 4/2016 | Nakamura | H05K 3/0067 361/782 |
| 2016/0152004 A1* | 6/2016 | Niino | H01L 23/3736 428/663 |

* cited by examiner

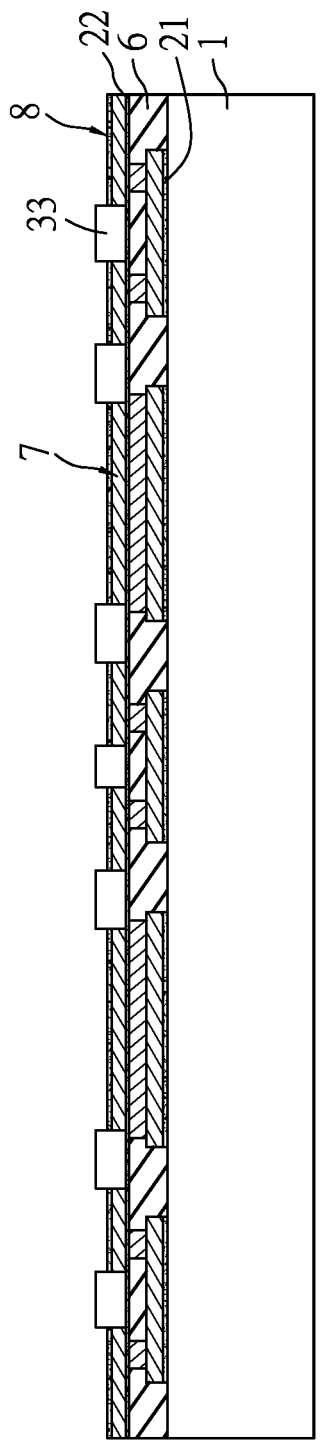
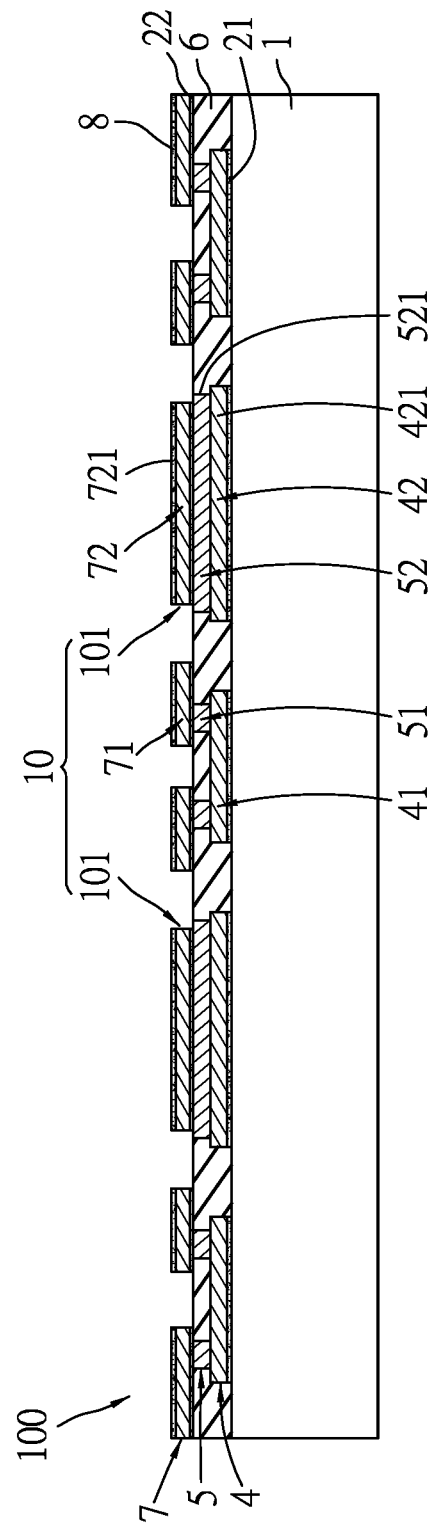
FIG. 13
FIG. 14

MULTILAYER CIRCUIT BOARD AND METHOD FOR MANUFACTURING THE SAME

CROSS-REFERENCE TO RELATED APPLICATION

This application claims priority of Taiwanese Patent Application No. 103115713, filed on May 1, 2014.

BACKGROUND OF THE INVENTION

The invention relates to a multilayer circuit board and a method for manufacturing the same, and more particularly to a method for manufacturing a multilayer circuit board that includes forming a patterned conductive layer which has a submount pattern and a circuit pattern.

It is known in the art that high power chips may generate large amount of heat when working. A circuit board used for mounting the high power chips may be required to have high heat-dissipation efficiency to avoid heat generated from the high power chips from accumulating thereon.

One type of a conventional circuit board, such as Metal Core Printed Circuit Board (MCPCB), has been widely used for mounting the high power chips, especially for mounting LED chips, so that the heat resulting from the high power chips can be efficiently dissipated therethrough. A conventional MCPCB normally has a copper layer serving for conductive traces and soldering pads, a dielectric layer, and a base layer that is usually made of aluminum. Since the dielectric layer has a relatively low thermal conductivity value of about 0.1-0.5 W/mK and is sandwiched between the copper layer and the base layer, it becomes a thermal barrier for heat transfer from the copper layer to the base layer, which results in a decrease in heat dissipation efficiency.

Another type of the conventional circuit board has a structure that includes a plurality of through-holes and a plurality of metal blocks. The metal blocks are inserted fittingly into the through-holes for mounting and heat dissipation of semiconductor chips and/or components. In order to secure the metal blocks in the through-holes, the metal blocks have a diameter or cross-section that is slightly greater than those of the through-holes, which causes undesired stress in the circuit board. In addition, since the metal blocks are formed using mechanical machining techniques, control of machining the same may be relatively difficult and a high precision of the metal blocks may be difficult to achieve when the size and the thickness of the metal blocks are small. Moreover, since the metal blocks are inserted into the through-holes using a pick and place machine, there may arise a precision problem for alignment of the metal blocks with interconnections that are subsequently formed on the circuit board for connecting the metal blocks to the semiconductor chips and/or components, such that misalignment between the metal blocks and the interconnections tend to occur.

SUMMARY OF THE INVENTION

Therefore, an object of the present invention is to provide a method for manufacturing a multilayer circuit board that can overcome at least one of the aforesaid drawbacks associated with the prior art.

According to one aspect of the present invention, there is provided a method for manufacturing a multilayer circuit board having a submount structure for mounting and heat dissipation of at least one semiconductor chip. The method comprises: providing a ceramic substrate; forming a first patterned conductive layer that is stacked on the ceramic substrate along a stacking direction, the first patterned conductive layer having a first circuit pattern and a first submount pattern; forming a second patterned conductive layer that is stacked on the first patterned conductive layer, the second patterned conductive layer having a second circuit pattern which is connected to the first circuit pattern, and a second submount pattern which is connected to and at least partially overlaps the first submount pattern along the stacking direction; forming an insulating layer on the ceramic substrate, such that the insulating layer is disposed among the first and second circuit patterns and the first and second submount patterns and that a top surface of the second patterned conductive layer is exposed from the insulating layer; and forming a third patterned conductive layer that is stacked on the insulating layer and the top surface of the second patterned conductive layer. The third patterned conductive layer has a third circuit pattern which is connected to the second circuit pattern, and a third submount pattern which is connected to and at least partially overlaps the second submount pattern along the stacking direction. The second circuit pattern has a plurality of interconnections interconnecting the first circuit pattern and the third circuit pattern. The submount structure includes at least the first, second and third submount patterns.

According to another aspect of the present invention, there is provided a multilayer circuit board that is adapted for mounting and heat dissipation of at least one semiconductor chip. The multilayer circuit board comprises: a ceramic substrate, a first patterned conductive layer, a second patterned conductive layer, an insulating layer, and a third patterned conductive layer. The first patterned conductive layer is stacked on the ceramic substrate along a stacking direction, and has a first circuit pattern and a first submount pattern. The second patterned conductive layer is stacked on the first patterned conductive layer, and has a second circuit pattern which is connected to the first circuit pattern, and a second submount pattern which is connected to and at least partially overlaps the first submount pattern along the stacking direction. The insulating layer is stacked on the ceramic substrate and is disposed among the first and second circuit patterns and the first and second submount patterns, such that a top surface of the second patterned conductive layer is exposed from the insulating layer. The third patterned conductive layer is stacked on the insulating layer and the top surface of the second patterned conductive layer, and has a third circuit pattern which is connected to the second circuit pattern, and a third submount pattern which is connected to and at least partially overlaps the second submount pattern along the stacking direction and which is adapted for mounting of the semiconductor chip thereon. The second circuit pattern has a plurality of interconnections interconnecting the first circuit pattern and the third circuit pattern.

BRIEF DESCRIPTION OF THE DRAWINGS

Other features and advantages of the present invention will become apparent in the following detailed description of the embodiment with reference to the accompanying drawings, of which:

FIGS. 1 to 14 are schematic views illustrating consecutive steps of the embodiment of a method for manufacturing a multilayer circuit board;

DETAILED DESCRIPTION OF THE EMBODIMENT

The above-mentioned and other technical contents, features, and effects of this invention will be clearly presented from the following detailed description of the embodiment in coordination with the reference drawings.

Figure 15:
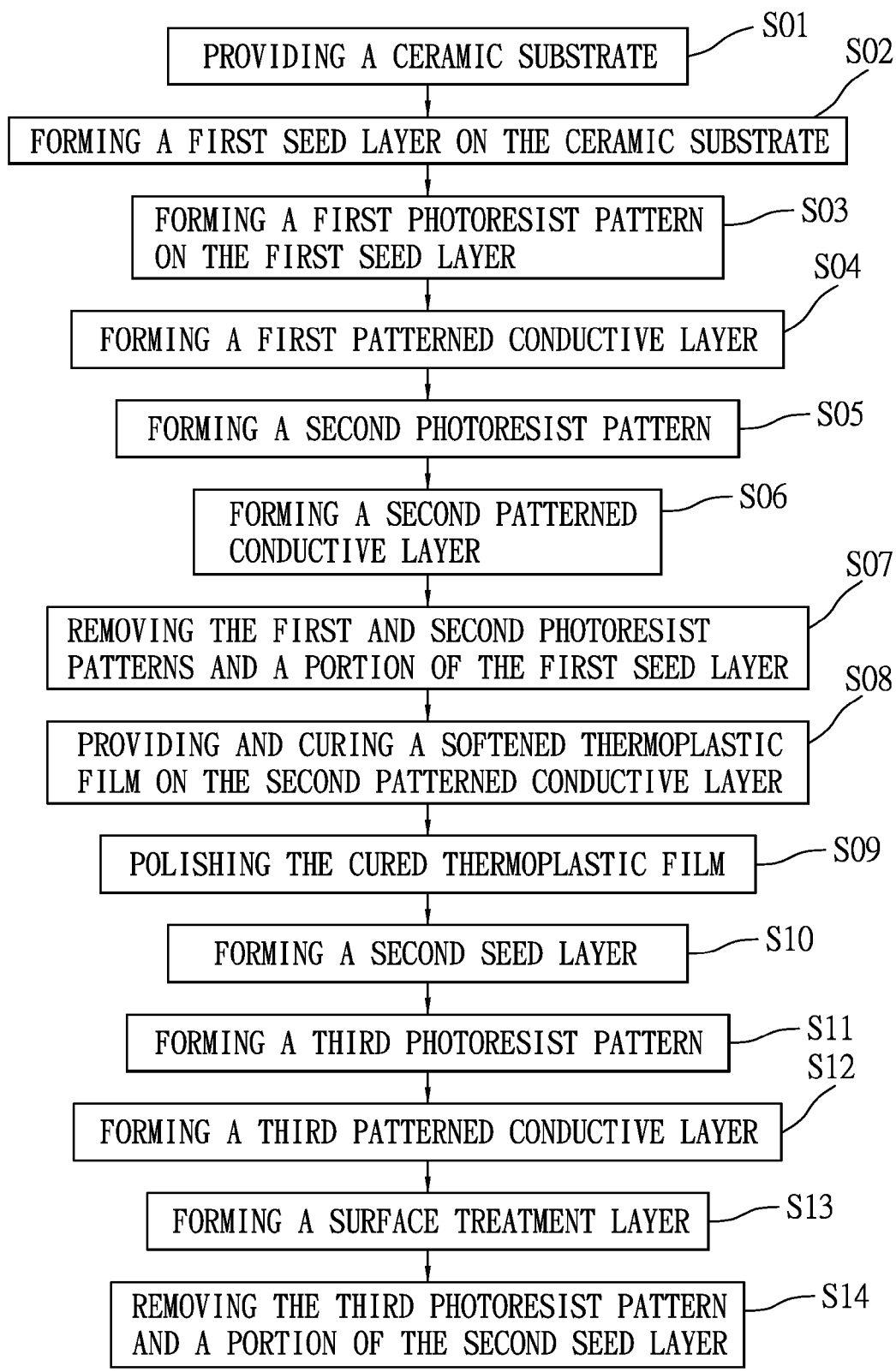
FIG. 15 is a flow chart of the embodiment.

FIG. 15, together with FIGS. 1 to 14, illustrates consecutive steps (S01-S14) of the embodiment of a method for manufacturing a multilayer circuit board having a metallic submount structure 10 for mounting and heat dissipation of at least one semiconductor chip 9 (see FIG. 16), such as an LED chip, according to the present invention.

Figure 1:
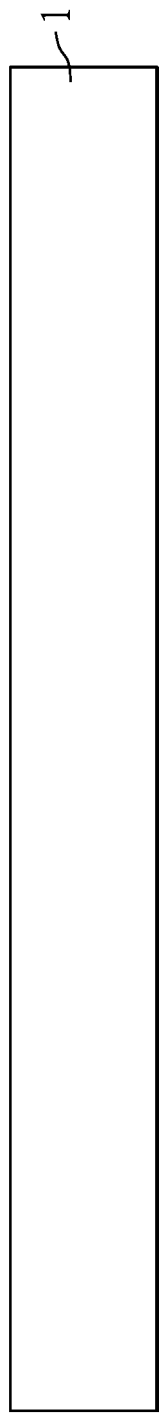
Figure 2:
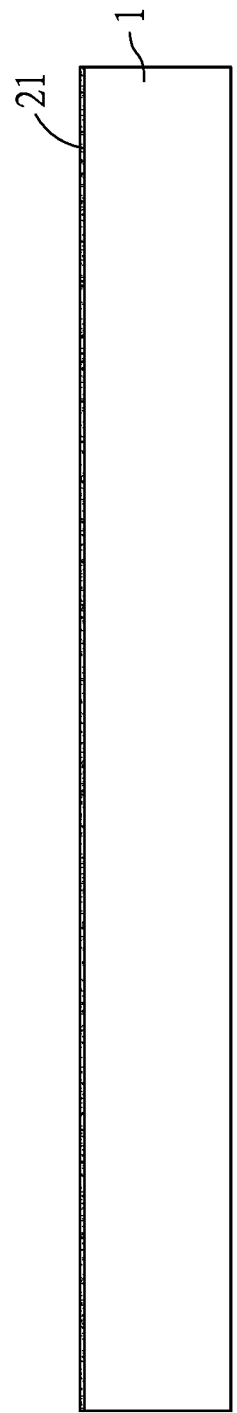
Figure 3:
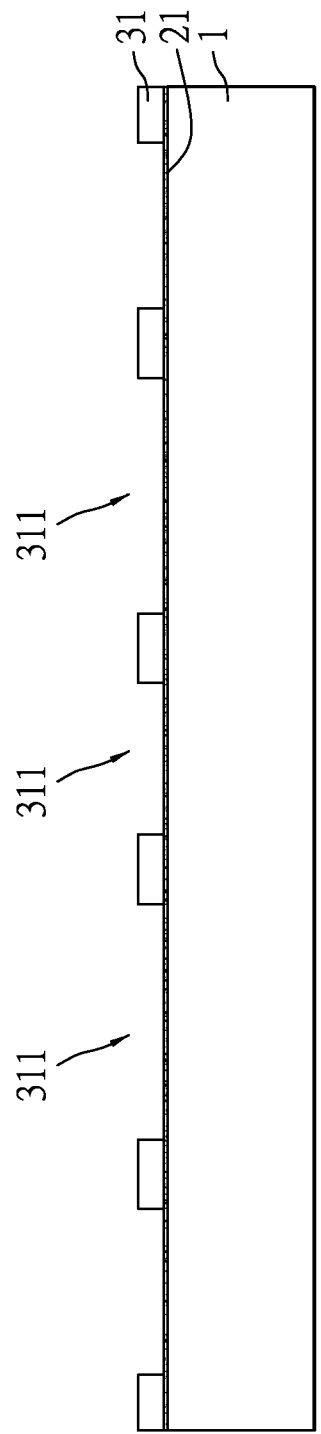
Figure 4:
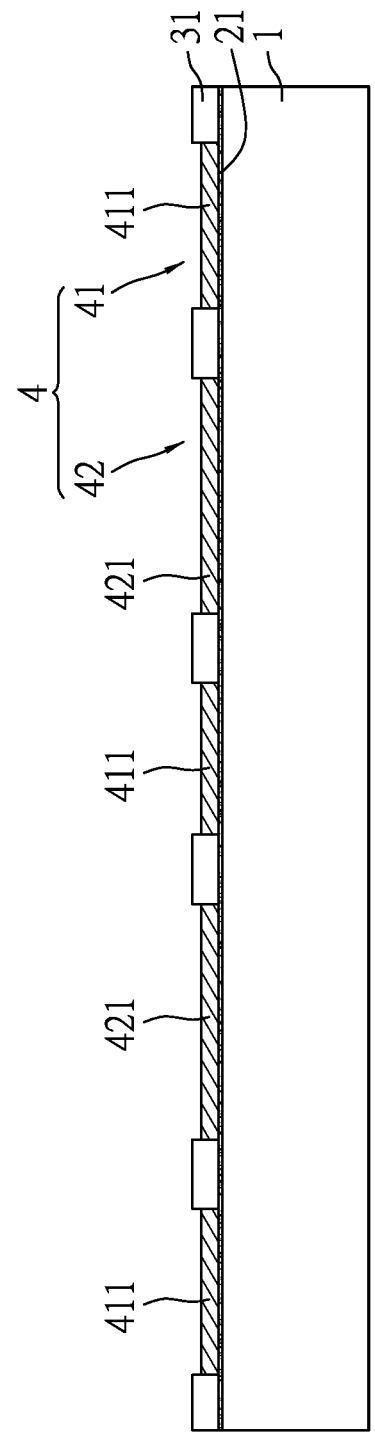
Figure 5:
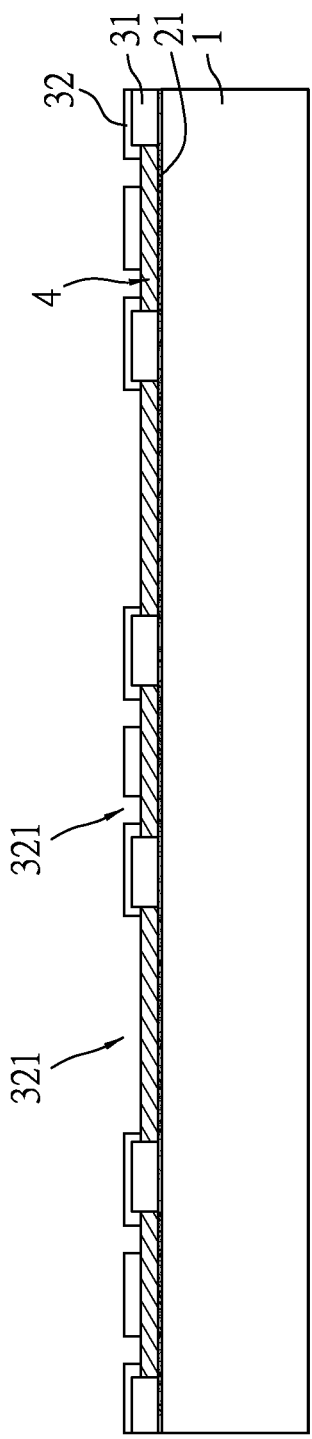

Step S01: providing a ceramic substrate 1 (see FIG. 1). The ceramic substrate 1 is made from a material selected from the group consisting of aluminum oxide, aluminum nitride, silicon nitride, zirconia, and zirconia toughened alumina.

Step S02: forming a first seed layer 21 on a surface of the ceramic substrate 1 (see FIG. 2) by sputtering. The first seed layer 21 is used for subsequent electroplating.

Step S03: forming a first photoresist pattern 31 on the first seed layer 21 by photolithography, the first photoresist pattern 31 having holes 311 that expose a portion of the first seed layer 21.

Step S04: forming a first patterned conductive layer 4 on the portion of the first seed layer 21 that is not covered by the first photoresist pattern 31 (see FIG. 4), such that the first patterned conductive layer 4 is stacked on the ceramic substrate 1 along a stacking direction (in this embodiment, the first patterned conductive layer 4 is directly formed on and contacts the ceramic substrate 1). The first patterned conductive layer 4 has a first circuit pattern 41 that includes a plurality of lower traces 411, and a first submount pattern 42 that includes a plurality of first pads 421. In this embodiment, the first patterned conductive layer 4 is made from copper, and is formed by electroplating.

Step S05: forming a second photoresist pattern 32 on the first patterned conductive layer 4 and the first photoresist pattern 31 (see FIG. 5) by photolithography, the second photoresist pattern 32 having holes 321 that expose a portion of the first patterned conductive layer 4.

Figure 6:
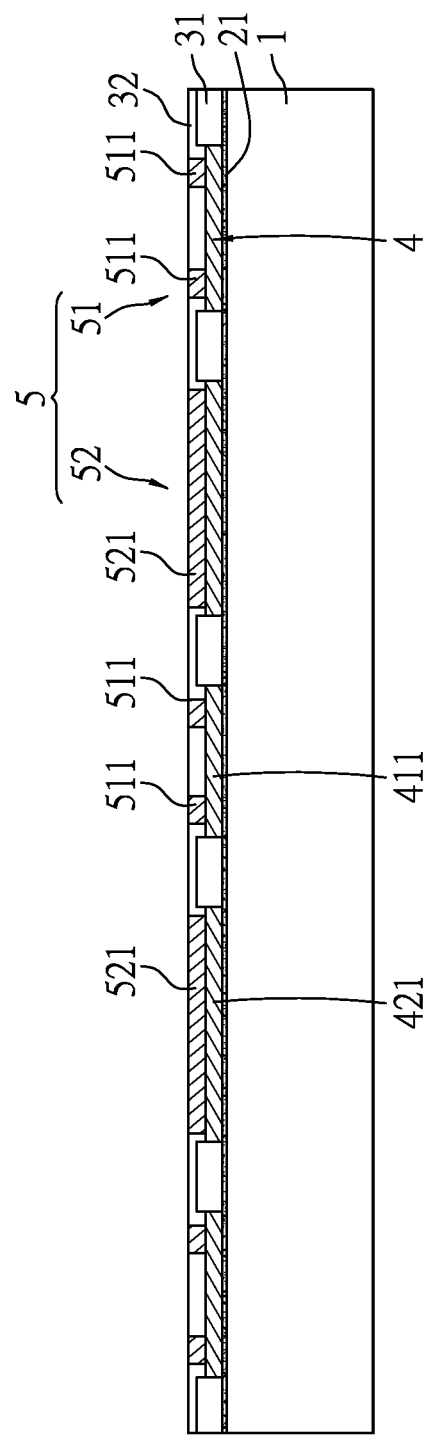
Figure 7:
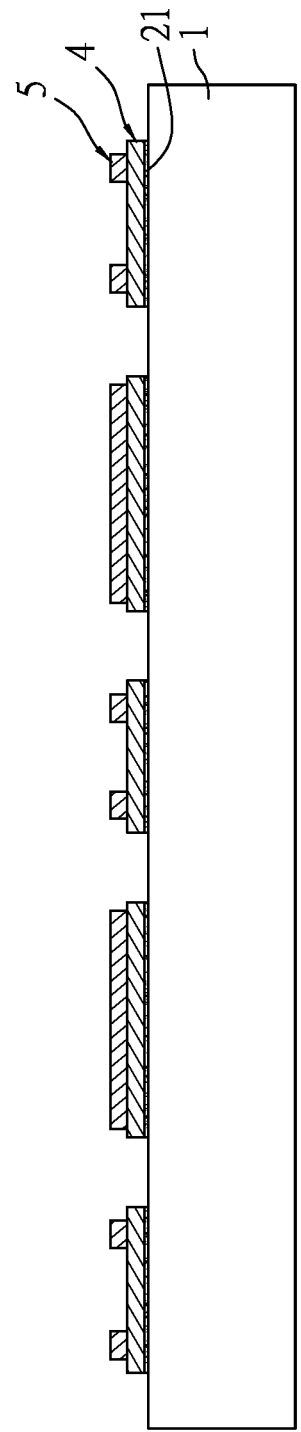

Step S06: forming a second patterned conductive layer 5 on the portion of the first patterned conductive layer 4 that is not covered by the second photoresist pattern 32 (see FIG. 6). The second patterned conductive layer 5 has a second circuit pattern 51 which is connected to the first circuit pattern 41 (see FIG. 3) and which includes a plurality of interconnections 511, and a second submount pattern 52 which is connected to and at least partially overlaps the first submount pattern 42 (see FIG. 3) along the stacking direction. Specifically, the second submount pattern 52 includes a plurality of second pads 521, each of which is connected to and at least partially overlaps a corresponding one of the first pads 421 of the first submount pattern 42 along the stacking direction. In this embodiment, the second patterned conductive layer 5 is also made from copper, and is formed by electroplating.

Step S07: removing the first and second photoresist patterns 31, 32 and the remaining portion of the first seed layer 21 that is not covered by the first patterned conductive layer 4 (see FIG. 7) after forming the second patterned conductive layer 5.

Figure 8:
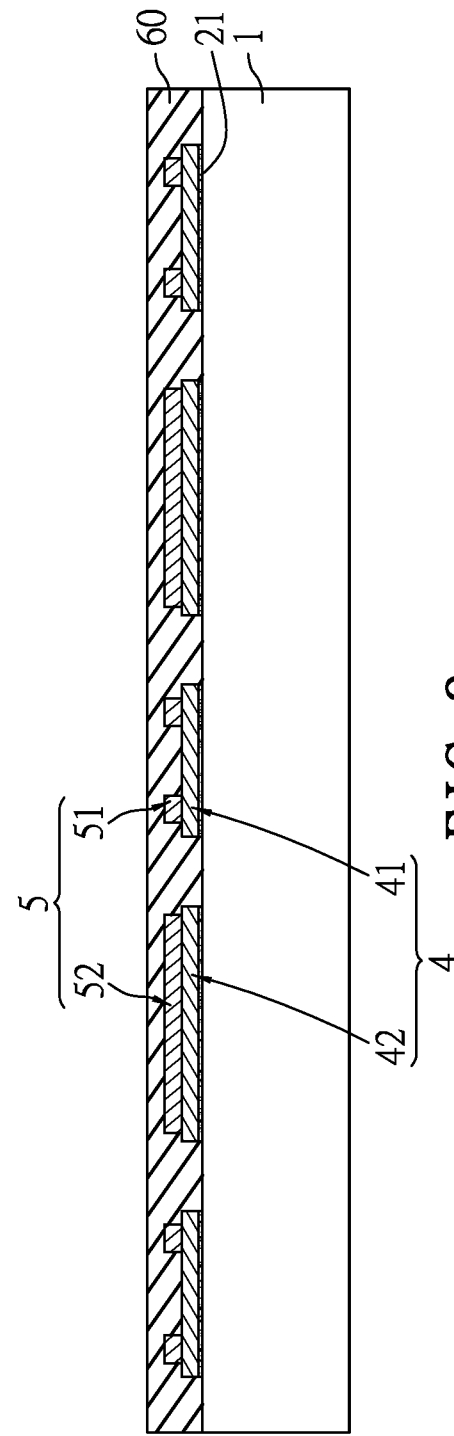
Figure 9:
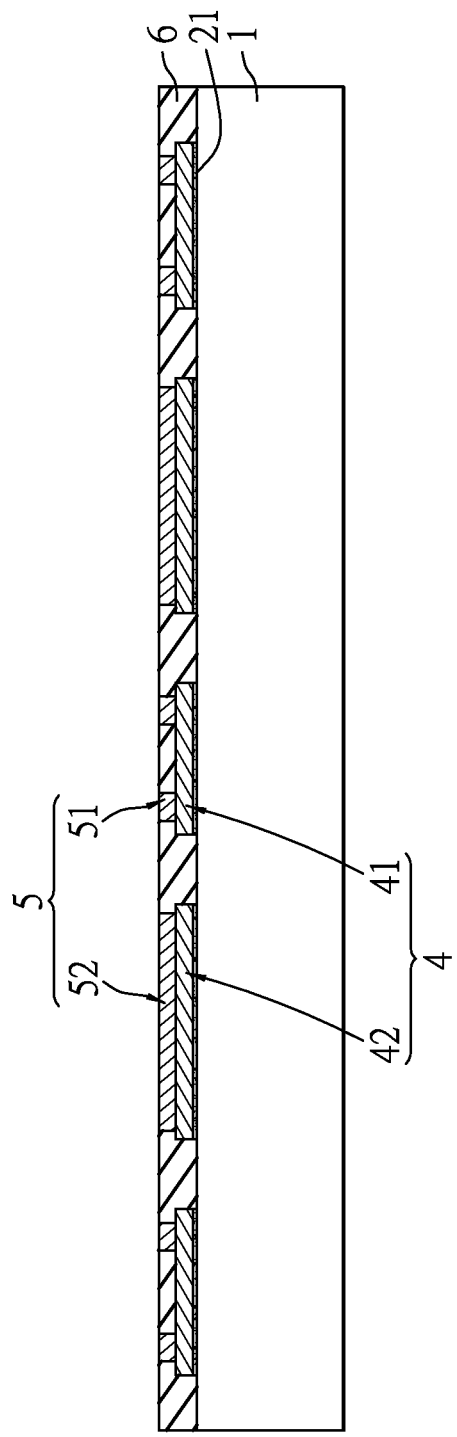
Figure 10:
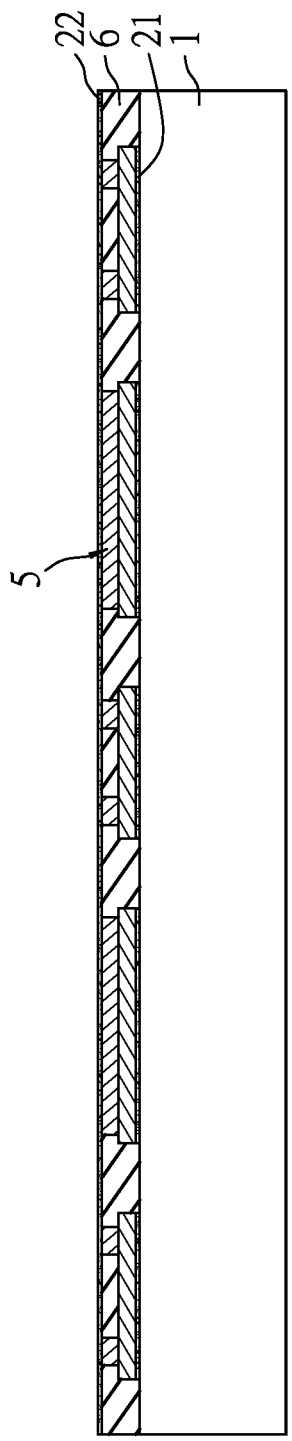
Figure 11:
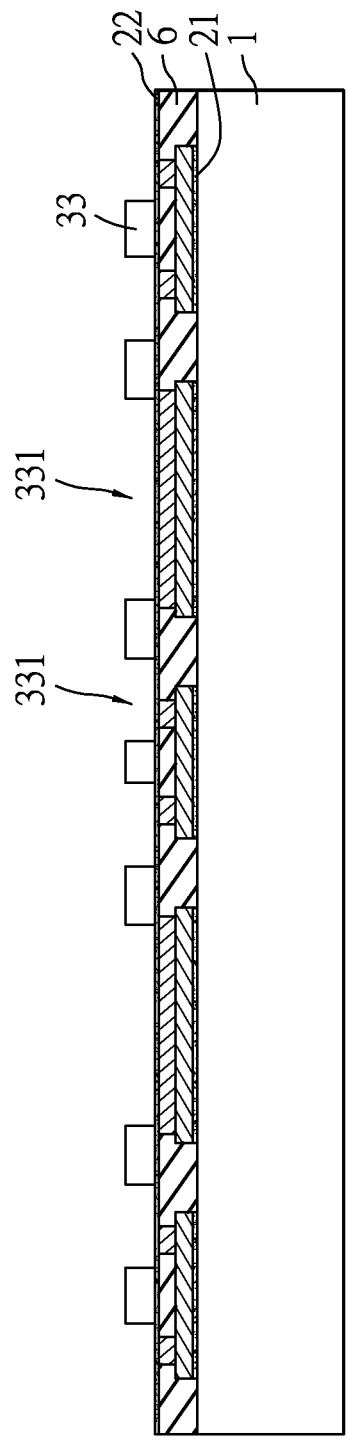
Figure 12:
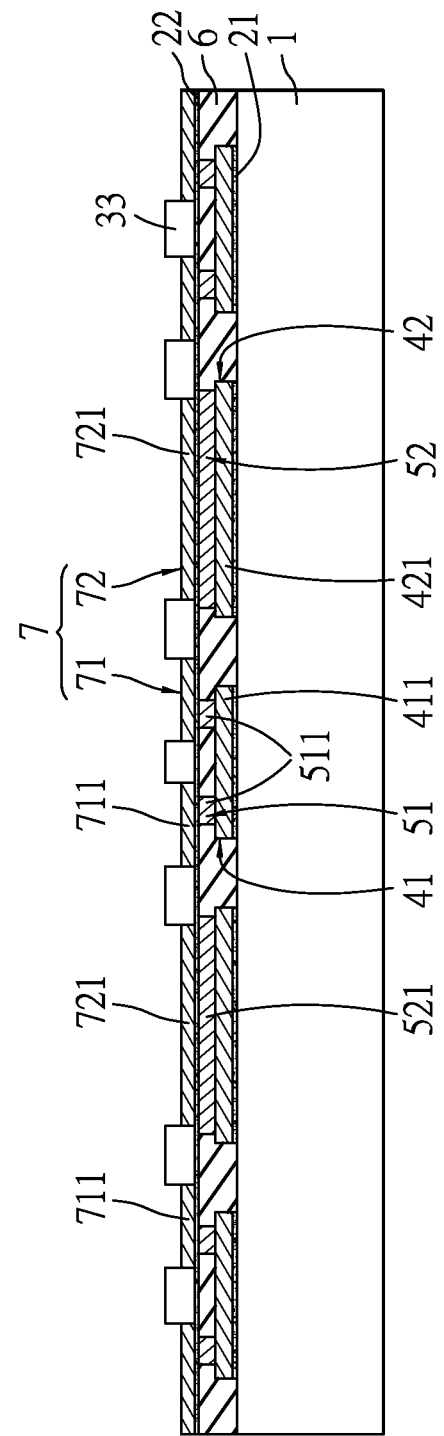

Step S08: providing a softened thermoplastic film 60 to cover the ceramic substrate 1 and the first and second patterned conductive layers 4, 5 and to fill gaps among the first and second circuit patterns 41, 51 and the first and second submount patterns 42, 52, followed by curing the softened thermoplastic film 60 (see FIG. 8).

Step S09: polishing the cured thermoplastic film 60 to expose a top surface of the second patterned conductive layer 5 (see FIG. 9), thereby forming an insulating layer 6 on the ceramic substrate 1, such that the insulating layer 6 is disposed among the first and second circuit patterns 41, 51 and the first and second submount patterns 42, 52 and that the top surface of the second patterned conductive layer 5 is exposed from the insulating layer 6.

Step S10: forming a second seed layer 22 on the insulating layer 6 and the top surface of the second patterned conductive layer 5 (see FIG. 10) by sputtering for subsequent electroplating.

Step S11: forming a third photoresist pattern 33 on the second seed layer 22 by photolithography (see FIG. 11), the third photoresist pattern 33 having holes 331 that expose a portion of the second seed layer 22.

Step S12: forming a third patterned conductive layer 7 on the portion of the second seed layer 22 that is not covered by the third photoresist pattern 33 (see FIG. 12), such that the third patterned conductive layer 7 is stacked on the insulating layer 6 and the top surface of the second patterned conductive layer 5. The third patterned conductive layer 7 has a third circuit pattern 71 which is connected to the second circuit pattern 51, and a third submount pattern 72 which is connected to and at least partially overlaps the second submount pattern 52 along the stacking direction. Specifically, the third circuit pattern 71 includes a plurality of upper traces 711 that are electrically connected to the lower traces 411 of the first circuit pattern 41 through the interconnections 511 of the second circuit pattern 51. The third submount pattern 72 includes a plurality of third pads 721, each of which is connected to and at least partially overlaps a corresponding one of the second pads 521 of the second submount pattern 52 along the stacking direction. In this embodiment, the third patterned conductive layer 7 is also made from copper, and is formed by electroplating.

Step S13: forming a surface finish layer 8 on the third patterned conductive layer 7 (see FIG. 13). In an embodiment, the surface finish layer 8 includes at least two metal sub-layers, each of which is made from a different metallic material selected from the group consisting of Ni, Au, Ag, and Pd. For example, the sub-layers may be made from Ni and Au, Ni and Pd, or Ni and Ag respectively. In another embodiment, the surface finish layer 8 may be made of a bi-metallic material. The bi-metallic material includes two of the following metals: Ni, Au, Ag, and Pd. Alternatively, the surface finish layer 8 is made from a different metallic material selected from the group consisting of Ni, Au, Ag, and Pd. The surface finish layer 8 is used for enhancing solderability and a bonding force for wire bonding.

Step S14: removing the third photoresist pattern 33 and the remaining portion of the second seed layer 22 that is not covered by the third patterned conductive layer 7 (see FIG. 14), thereby forming the multilayer circuit board 100. The first, second and third circuit patterns 41, 51, 71 form multilayer circuits. The first, second and third submount patterns 42, 52, 72, the portions of the first and second seed layers 21, 22, and the surface finish layer 8 cooperatively form the metallic submount structure 10 that is made from metal and that is directly formed on and contacts the ceramic substrate 1. Specifically, the submount structure 10 has a plurality of spaced apart submount blocks 101, each of which includes a corresponding one of the first, second and third pads 421, 521, 721 stacking along the stacking direction.

Figure 16:
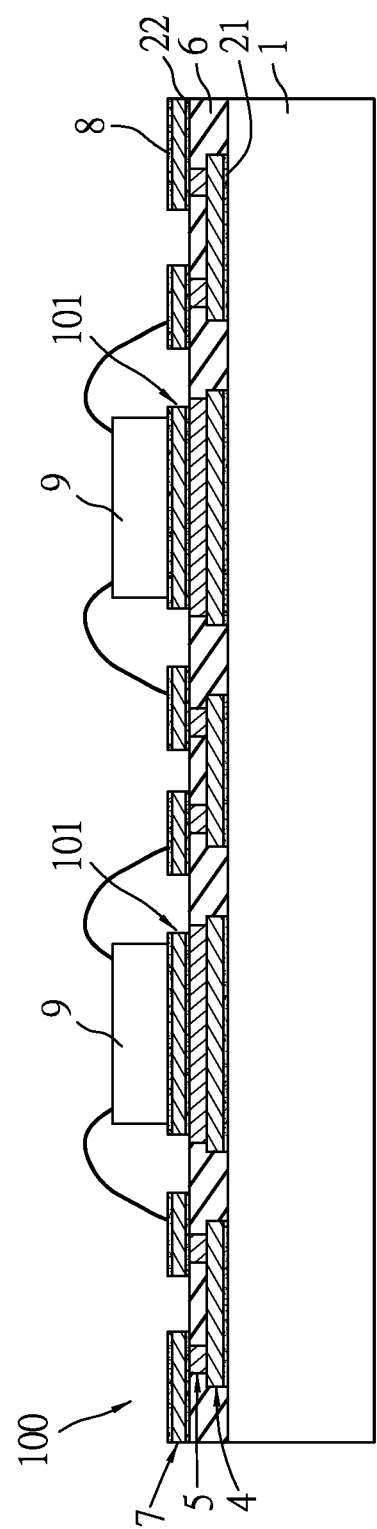
FIG. 16 is a schematic view illustrating a state where a plurality of semiconductor chips are mounted on the multi-layer circuit board of the embodiment.

The multilayer circuit board thus formed may be used for mounting of a plurality of semiconductor chips 9 on the submount blocks 101 through wire bonding techniques (see FIG. 16). In this embodiment, the semiconductor chips 9 are horizontal type light emitting diode (LED) chips. Alternatively, the semiconductor chips 9 may be vertical type light emitting diode (LED) chips.

Since the submount blocks 101 are formed through the formation of the first, second and third patterned conductive layers 4, 5, 7 that are stacked one above another according to the present invention, at least one of the aforesaid drawbacks associated with the prior art may be alleviated or overcome.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A multilayer circuit board adapted for mounting and heat dissipation of at least one semiconductor chip and comprising:
   a ceramic substrate;
   a first patterned conductive layer that is stacked on said ceramic substrate along a stacking direction, said first patterned conductive layer having a first circuit pattern and a first submount pattern, said first submount pattern including one or more first pads;
   a second patterned conductive layer that is stacked on said first patterned conductive layer, said second patterned conductive layer having a second circuit pattern which is connected to said first circuit pattern, and a second submount pattern which is connected to and at least partially overlaps said first submount pattern along the stacking direction, said second submount pattern including one or more second pads;
   an insulating layer stacked on said ceramic substrate and disposed among said first and second circuit patterns and said first and second submount patterns, such that a top surface of said second patterned conductive layer is exposed from said insulating layer; and
   a third patterned conductive layer that is stacked on said insulating layer and said top surface of said second patterned conductive layer, said third patterned conductive layer having a third circuit pattern which is connected to said second circuit pattern, and a third submount pattern which is connected to and at least partially overlaps said second submount pattern along the stacking direction and which is adapted for mounting of the semiconductor chip thereon, said third submount pattern including one or more third pads;
   wherein said second circuit pattern has a plurality of interconnections interconnecting said first circuit pattern and said third circuit pattern,
   and
   wherein at least said first, second and third submount patterns constitute a submount structure adapted for mounting and heat dissipation of the at least one semiconductor chip, said submount structure having at least one submount block which includes a corresponding one of said one or more first pads, a corresponding one of said one or more second pads, and a corresponding one of said one or more third pads, said first, second, and third pads of each of said at least one submount block being stacked one above another along the stacking direction such that said insulating layer steers clear of stacking of said first, second, and third pads along the stacking direction.

2. The multilayer circuit board as claimed in claim 1, further comprising a first seed layer sandwiched between said first patterned conductive layer and said ceramic substrate, and a second seed layer sandwiched between said third patterned conductive layer and said insulating layer.

3. The multilayer circuit board as claimed in claim 1, further comprising a surface finish layer formed on said third patterned conductive layer, wherein said surface finish layer includes at least two metal sub-layers, each of which is made from a different metallic material selected from the group consisting of Ni, Au, Ag, and Pd.

4. The multilayer circuit board as claimed in claim 1, wherein the submount structure is directly formed on and contacts the ceramic substrate.

5. The multilayer circuit board as claimed in claim 1, wherein the submount structure is made from metal.

* * * * *

UNITED STATES PATENT AND TRADEMARK OFFICE
CERTIFICATE OF CORRECTION

PATENT NO. : 9,801,288 B2
APPLICATION NO. : 14/700229
DATED : October 24, 2017
INVENTOR(S) : Chien-Cheng Wei and Ta-Hsiang Chiang It is certified that error appears in the above-identified patent and that said Letters Patent is hereby corrected as shown below:

On the Title Page

In Column 1, Item (71) Applicant, please replace:
--TONG HSING ELECTRONICS INDUSTRIES, LTD.--
With:
--TONG HSING ELECTRONIC INDUSTRIES, LTD.--

Signed and Sealed this
Sixth Day of February, 2018

Joseph Matal
*Performing the Functions and Duties of the*
*Under Secretary of Commerce for Intellectual Property and*
*Director of the United States Patent and Trademark Office*